(12) United States Patent
Kawaguchi et al.

(10) Patent No.: US 9,902,016 B2
(45) Date of Patent: Feb. 27, 2018

(54) LASER MACHINING DEVICE AND LASER MACHINING METHOD

(71) Applicant: HAMAMATSU PHOTONICS K.K., Hamamatsu-shi, Shizuoka (JP)

(72) Inventors: Daisuke Kawaguchi, Hamamatsu (JP); Tsubasa Hirose, Hamamatsu (JP); Keisuke Araki, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 165 days.

(21) Appl. No.: 14/778,619

(22) PCT Filed: Mar. 13, 2014

(86) PCT No.: PCT/JP2014/056724
§ 371 (c)(1),
(2) Date: Sep. 21, 2015

(87) PCT Pub. No.: WO2014/156688
PCT Pub. Date: Oct. 2, 2014

(65) Prior Publication Data
US 2016/0052083 A1    Feb. 25, 2016

(30) Foreign Application Priority Data

Mar. 27, 2013  (JP) .................................. 2013-065978

(51) Int. Cl.
*B23K 26/00*  (2014.01)
*B23K 26/067*  (2006.01)
(Continued)

(52) U.S. Cl.
CPC ...... *B23K 26/0057* (2013.01); *B23K 26/0648* (2013.01); *B23K 26/0736* (2013.01);
(Continued)

(58) Field of Classification Search
CPC ...... B23K 26/00; B23K 26/067; B23K 26/53; B23K 26/06
(Continued)

(56) References Cited

U.S. PATENT DOCUMENTS

| | | | | |
|---|---|---|---|---|
| 5,490,849 A | * | 2/1996 | Smith | ................. A61F 9/00804 |
| | | | | 219/121.6 |
| 2009/0128824 A1 | * | 5/2009 | Leitgeb | ............. G01N 21/4795 |
| | | | | 356/446 |

(Continued)

FOREIGN PATENT DOCUMENTS

| | | |
|---|---|---|
| CN | 1967783 | 5/2007 |
| CN | 101346207 | 1/2009 |

(Continued)

OTHER PUBLICATIONS

International Preliminary Report on Patentability dated Oct. 8, 2015 for PCT/JP2014/056723.

(Continued)

*Primary Examiner* — Samuel M Heinrich
(74) *Attorney, Agent, or Firm* — Drinker Biddle & Reath LLP

(57) ABSTRACT

A laser processing device converges laser light at an object to be processed having a silicon part containing silicon mounted on a glass part containing glass with a resin part interposed therebetween so as to form a modified region within the object along a line to cut. The laser processing device comprises a laser light source emitting the laser light, a spatial light modulator modulating the laser light emitted from the laser light source, and a converging optical system converging the laser light modulated by the spatial light modulator at the object. When forming the modified region in the glass part, the spatial light modulator displays an axicon lens pattern as a modulation pattern so as to form (Continued)

converging points at a plurality of positions juxtaposed close to each other along a laser light irradiation direction.

12 Claims, 18 Drawing Sheets

(51) Int. Cl.
| | |
|---|---|
| *B23K 26/53* | (2014.01) |
| *B23K 26/06* | (2014.01) |
| *B23K 26/073* | (2006.01) |
| *C03B 33/02* | (2006.01) |
| *H01L 21/78* | (2006.01) |
| *B23K 26/40* | (2014.01) |
| *C03B 33/07* | (2006.01) |
| *B23K 103/16* | (2006.01) |
| *B23K 103/00* | (2006.01) |

(52) U.S. Cl.
CPC .............. *B23K 26/40* (2013.01); *B23K 26/53* (2015.10); *C03B 33/0222* (2013.01); *H01L 21/78* (2013.01); *B23K 2203/172* (2015.10); *B23K 2203/50* (2015.10); *B23K 2203/54* (2015.10); *C03B 33/07* (2013.01); *Y02P 40/57* (2015.11)

(58) Field of Classification Search
USPC ........................................ 219/121.67–121.72
See application file for complete search history.

(56) References Cited

U.S. PATENT DOCUMENTS

| | | |
|---|---|---|
| 2010/0025387 A1 | 2/2010 | Arai et al. |
| 2012/0095533 A1 | 4/2012 | Wang |
| 2012/0234807 A1 | 9/2012 | Sercel et al. |
| 2015/0158120 A1* | 6/2015 | Courvoisier ....... B23K 26/0613 264/482 |
| 2015/0166395 A1* | 6/2015 | Marjanovic ........ B23K 26/0057 428/131 |

FOREIGN PATENT DOCUMENTS

| | | |
|---|---|---|
| CN | 101516566 | 8/2009 |
| CN | 101772398 | 7/2010 |
| CN | 101784364 | 7/2010 |
| CN | 101861228 | 10/2010 |
| CN | 101965242 | 2/2011 |
| CN | 102307699 | 1/2012 |
| CN | 102725096 | 10/2012 |
| CN | 102741011 | 10/2012 |
| JP | 2005-262290 | 9/2005 |
| JP | 2006-130691 A | 5/2006 |
| JP | 2010-058128 | 3/2010 |
| JP | 2011-002698 A | 1/2011 |
| JP | 2011-051011 A | 3/2011 |
| JP | 2011-517299 | 6/2011 |
| JP | 2012-146877 | 8/2012 |
| JP | 2013-043204 | 3/2013 |
| WO | WO 2009/114375 | 9/2009 |
| WO | WO-2013/039162 A1 | 3/2013 |

OTHER PUBLICATIONS

International Preliminary Report on Patentability dated Oct. 8, 2015 for PCT/JP2014/056724.
International Preliminary Report on Patentability dated Oct. 8, 2015 for PCT/JP2014/056725.
International Preliminary Report on Patentability dated Oct. 8, 2015 for PCT/JP2014/056726.
International Preliminary Report on Patentability dated Oct. 8, 2015 for PCT/JP2014/056728.

* cited by examiner (a)

(b)

(a)

25y (b)

25x

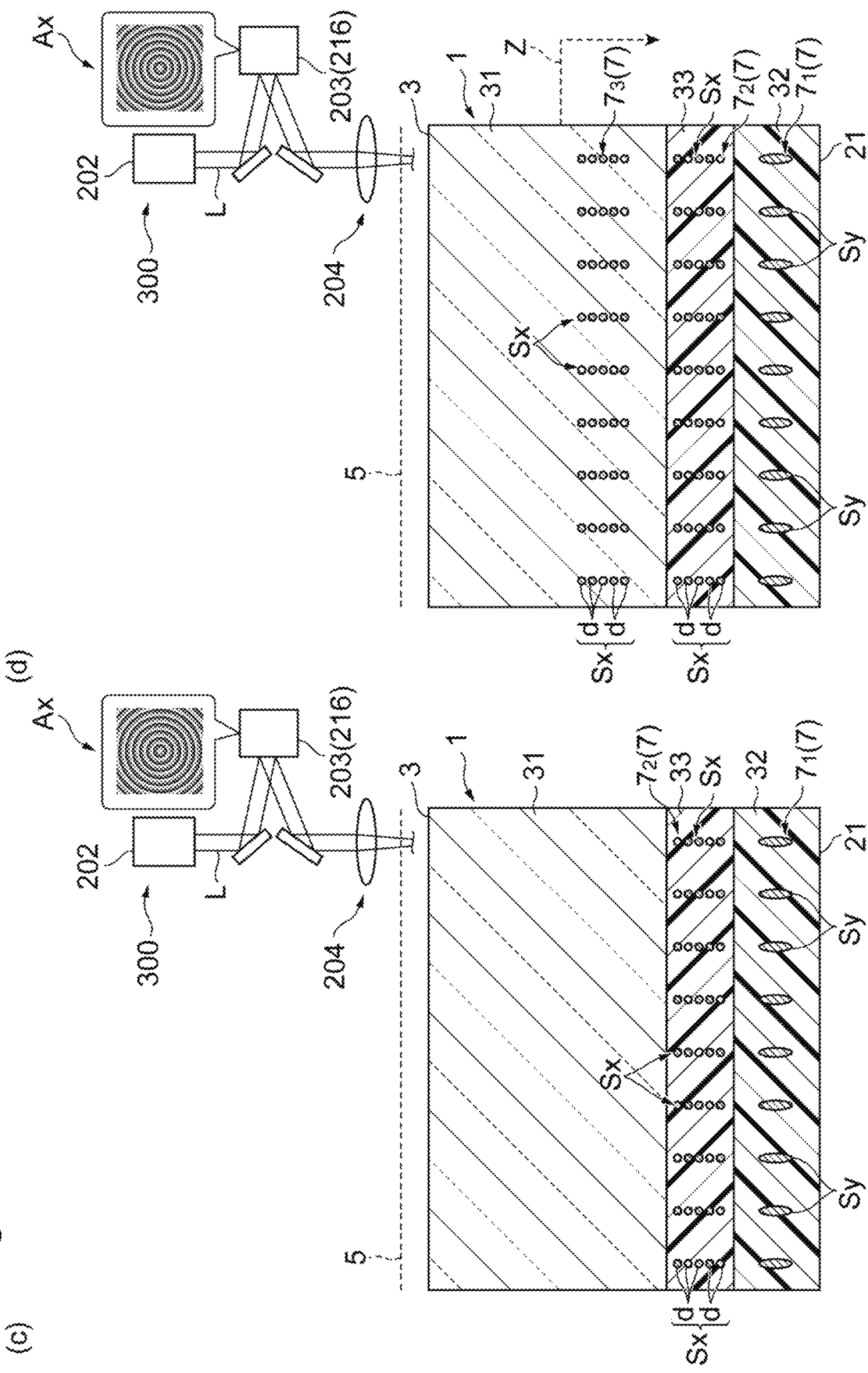

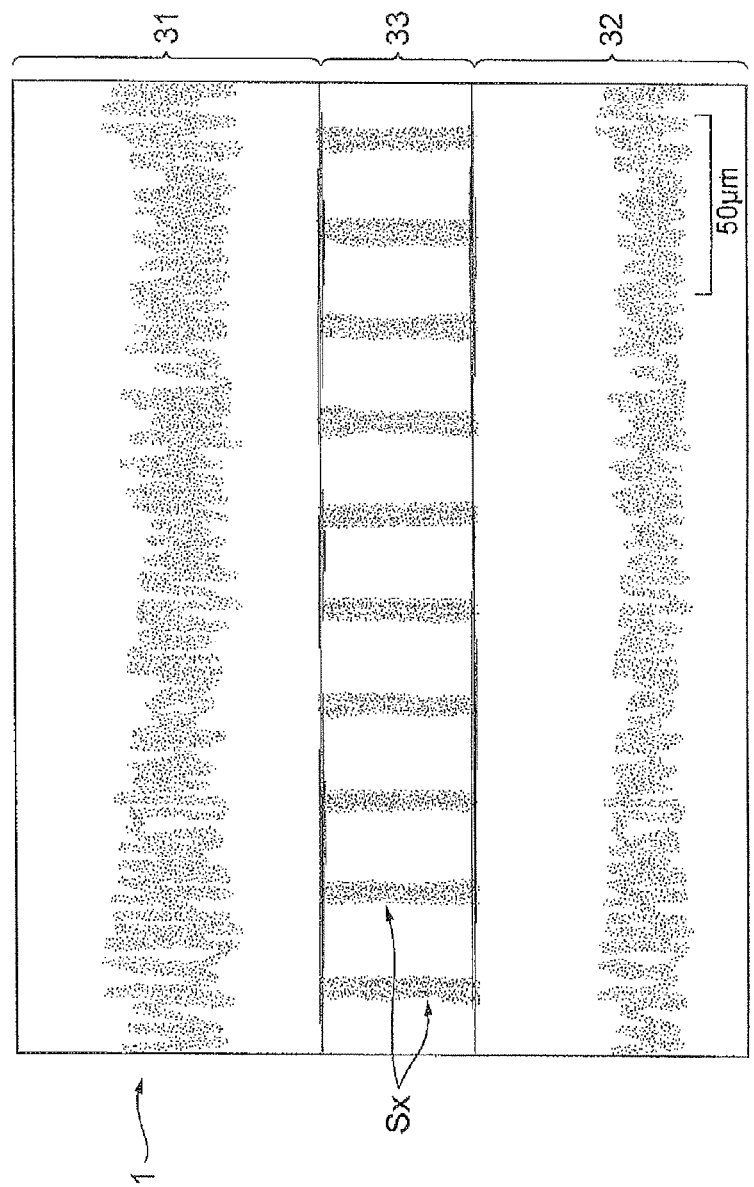

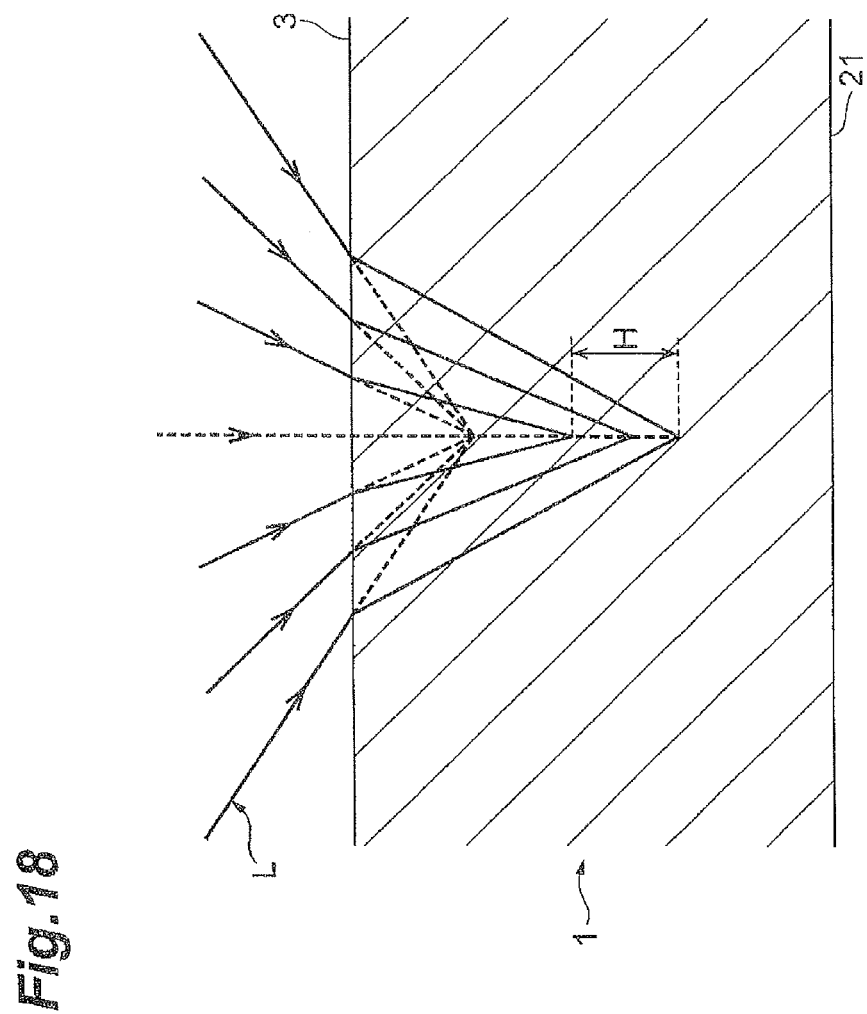

LASER MACHINING DEVICE AND LASER MACHINING METHOD

TECHNICAL FIELD

One aspect of the present invention relates to a laser processing device and a laser processing method.

BACKGROUND ART

Known as a conventional laser processing device is one which converges laser light at an object to be processed, so as to form a modified region within the object along a line to cut (see, for example, Patent Literature 1). In such a laser processing device, a spatial light modulator modulates laser light emitted from a laser light source to the object, so as to converge the laser light at a plurality of positions in the object.

CITATION LIST

Patent Literature

Patent Literature 1: Japanese Patent Application Laid-Open No. 2011-51011

SUMMARY OF INVENTION

Technical Problem

The above-mentioned conventional technique has been demanded to improve processing quality along with its wide-spreading use in recent years. For example, concerning the cut object, there have been increasing demands for ameliorating straightness in cut sections and improving bending strength. When processing an object to be processed in which a silicon part containing silicon is mounted on a glass part containing glass with a resin part interposed therebetween, for example, its processing quality has strongly been desired to improve in particular.

In view of the foregoing circumstances, it is an object of one aspect of the present invention to provide a laser processing device and laser processing method which can improve the processing quality.

Solution to Problem

The inventors conducted diligent studies for solving the problem mentioned above and, as a result, have found a possibility that, when a laser light converging part has a form elongated in the laser light incident direction of the laser light (hereinafter referred to as "vertically long") in the object so as to form a vertically long modified region in the object, the amount of fractures (cracks) occurring within the object can decrease, so as to ameliorate the straightness in the cut sections and the bending strength, thereby improving the processing quality.

In this case, however, there is a fear of the energy density decreasing in the laser light converging part so that the modified region itself may fail to be formed or a large amount of energy being consumed for processing. In this regard, the inventors further conducted diligent studies and have found that such a fear can be coped with by modulating the laser light as appropriate by using a spatial light modulator, thereby completing the present invention, That is, the laser processing device in accordance with one aspect of the present invention is a laser processing device for converging laser light at an object to be processed having a silicon part containing silicon mounted on a glass part containing glass with a resin part interposed therebetween so as to form a modified region within the object along a line to cut, the laser processing device comprising a laser light source emitting the laser light, a spatial light modulator modulating the laser light emitted from the laser light source, and a converging optical system converging the laser light modulated by the spatial light modulator at the object; when forming the modified region in the glass part, the spatial light modulator displays an axicon lens pattern as a modulation pattern so as to form converging points at a plurality of positions juxtaposed close to each other along a laser light irradiation direction. By the "axicon lens pattern" is meant a modulation pattern generated such as to achieve an action of an axicon lens (the same shall apply hereinafter).

By causing the spatial light modulator to display the axicon lens pattern as the modulation pattern, this laser processing device can converge the laser light at the glass part such that converging points are formed at a plurality of positions juxtaposed close to each other along the laser light irradiation direction. This forms a pseudo vertically long converging part while fully keeping its energy density, whereby a vertically long modified region is formed in the glass part. As with the above-mentioned finding, such a modified region can reduce the amount of fractures occurring within the glass part, whereby it is also possible to ameliorate the straightness in the cut sections and the bending strength and improve the processing quality also in the object including the glass part.

Specifically, for exhibiting the operation and effect mentioned above, the laser processing device may form a plurality of modified spots within the object along the line and let a plurality of the modified regions form the modified region; when forming the modified region in the glass part, the spatial light modulator may form modified dots respectively at the plurality of positions juxtaposed close to each other along the laser light irradiation direction; and a plurality of the modified dots may constitute the modified spot elongated in the laser light irradiation direction.

In a display part of the spatial light modulator, the axicon lens pattern may have a circular region located at a center of the laser light incident thereon and a plurality of circular ring regions demarcated about the center region concentrically with the circular region, each of the circular region and the plurality of circular ring regions being set such as to increase brightness gradually from radially outer side to inner side.

The device may further comprise a controller controlling the laser light, the controller controlling a position of a converging point of the laser light so as to form the modified region within the glass part, only in a part on the silicon part side from a center of the glass part, in the laser light irradiation direction. This can improve throughput, while keeping an improvement in the processing quality, as compared with the case where the modified region is formed in substantially the whole region in the laser light irradiation direction of the glass part.

When forming the modified region in the resin part, the spatial light modulator may display an axicon lens pattern as a modulation pattern, so as to converge the laser light such that converging points are formed respectively at a plurality of positions juxtaposed close to each other along the laser light irradiation direction. This forms a pseudo vertically long converging part while fully keeping its energy density, whereby a vertically long modified region is formed in the resin part. This makes the present invention effective in particular, since fractures are inherently hard to expand in the resin part.

The laser processing method in accordance with one aspect of the present invention is a laser light processing method for converging laser light at an object to be processed having a silicon part containing silicon mounted on a glass part containing glass with a resin part interposed therebetween so as to form a modified region within the object along a line to cut, the method comprising the step of forming the modified region in the glass part by modulating the laser light emitted from a laser light source with a spatial light modulator and converging the laser light modulated by the spatial light modulator within the glass part; the step of forming the modified region in the glass part causes the spatial light modulator to display an axicon lens pattern as a modulation pattern so as to form converging points within the glass part at a plurality of positions juxtaposed close to each other along a laser light irradiation direction.

This laser processing method also forms a pseudo vertically long converging part while fully keeping its energy density, whereby a vertically long modified region is formed in the glass part. Therefore, the above-mentioned operation and effect of being able to improve the processing quality is exhibited.

Advantageous Effects of Invention

One aspect of the present invention can provide a laser processing device and laser processing method which can improve the processing quality.

BRIEF DESCRIPTION OF DRAWINGS

FIG. 16 is a schematic sectional view illustrating a sequel to FIG. 15;

FIG. 17 is a sectional view explaining an example of modified regions formed in a resin layer by the laser processing method in accordance with the second embodiment; and FIG. 18 is a diagram for explaining aberrations occurring at converging positions of laser light.

DESCRIPTION OF EMBODIMENTS

In the following, preferred embodiments in accordance with one aspect of the present invention will be explained in detail with reference to the drawings. In the following explanations, the same or equivalent constituents will be referred to with the same signs while omitting their overlapping descriptions.

The laser processing device and laser processing method in accordance with an embodiment converges laser light at an object to be processed with laser light, so as to form a modified region along a line to cut. Therefore, the forming of the modified region will be explained at first with reference to FIGS. 1 to 6.

Figure 1:
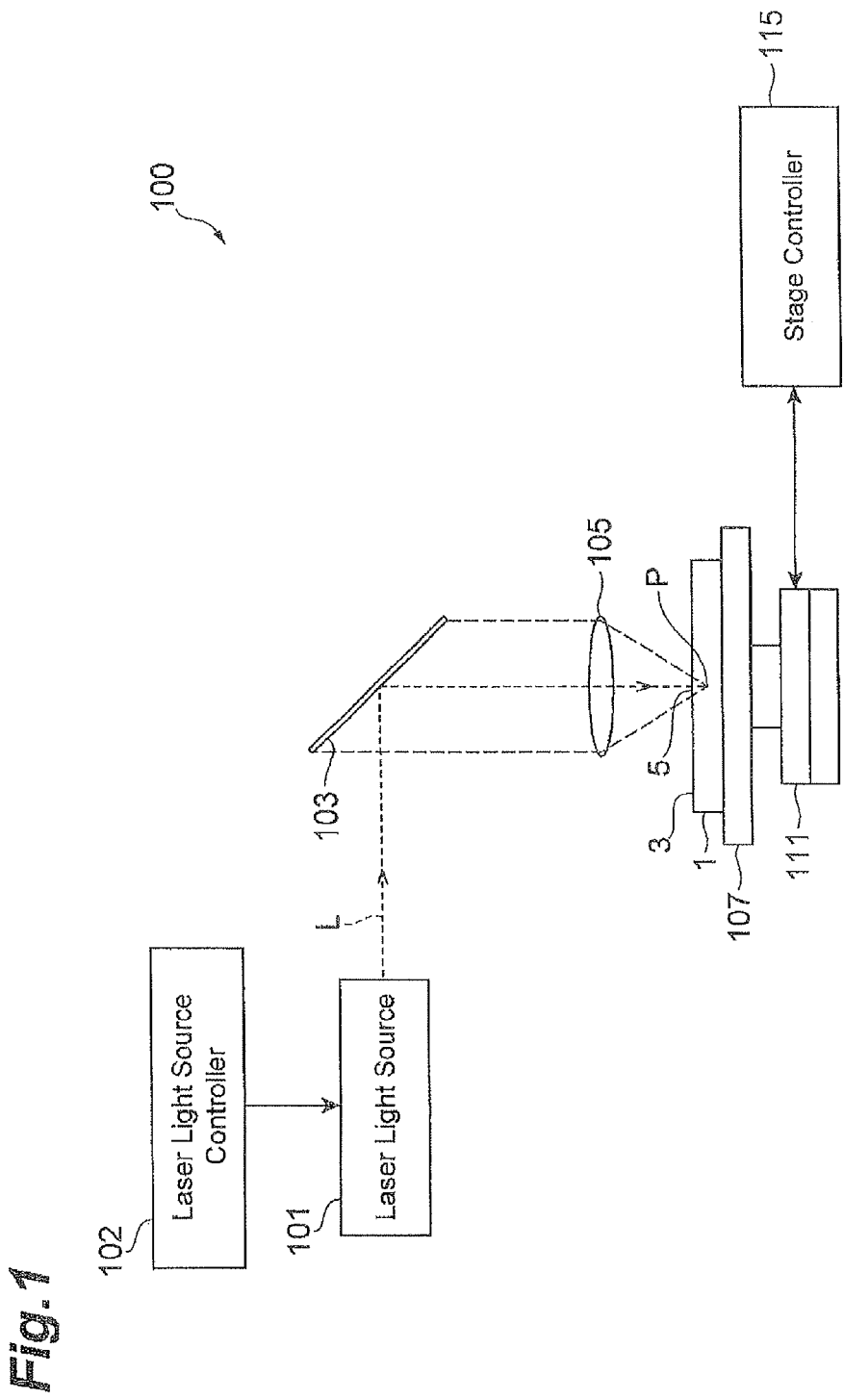
FIG. 1 is a schematic structural diagram of a laser processing device used for forming a modified region.

As illustrated in FIG. 1, a laser processing device 100 comprises a laser light source 101 for causing laser light L to oscillate in a pulsating manner, a dichroic mirror 103 arranged such as to change the direction of the optical axis (optical path) of the laser light L by 90°, and a converging lens 105 for converging the laser light L. The laser processing device 100 further comprises a support table 107 for supporting an object to be processed 1 which is irradiated with the laser light L converged by the converging lens 105, a stage 111 for moving the support table 107, a laser light source controller 102 for regulating the laser light source 101 in order to adjust the output, pulse width, pulse waveform, and the like of the laser light L, and a stage controller 115 for regulating the movement of the stage 111.

In the laser processing device 100, the laser light L emitted from the laser light source 101 changes the direction of its optical axis by 90° with the dichroic mirror 103 and then is converged by the converging lens 105 into the object 1 mounted on the support table 107. At the same time, the stage 111 is shifted, so that the object 1. moves relative to the laser light L along a line to cut 5. This forms a modified region in the object 1 along the line 5. While the stage 111 is shifted here for relatively moving the laser light L, the converging lens 105 may be shifted instead or together therewith.

Figure 2:
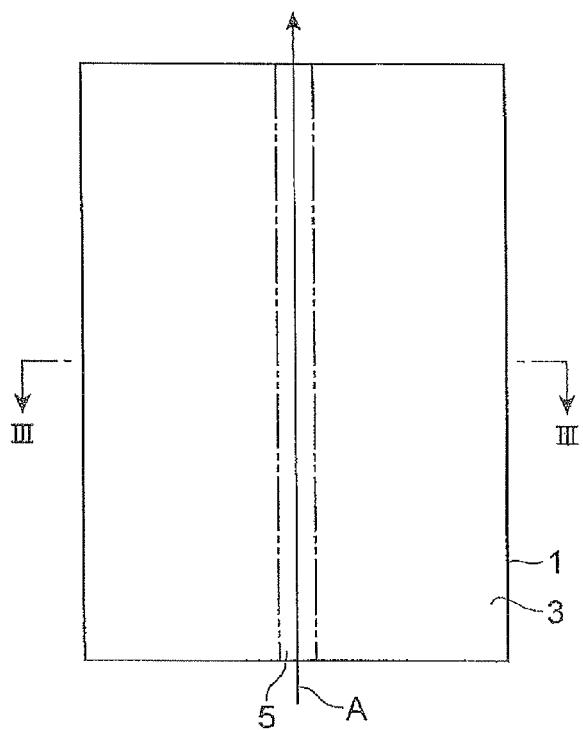
FIG. 2 is a plan view of an object to be processed for which the modified region is formed.
Figure 3:
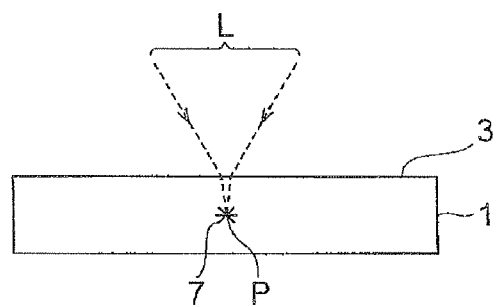
FIG. 3 is a sectional view of the object taken along the line III-III of FIG. 2.
Figure 4:
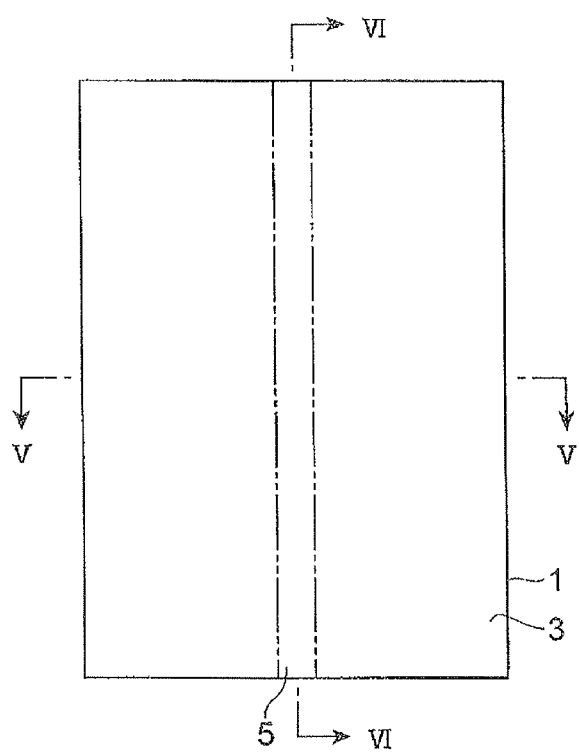
FIG. 4 is a plan view of the object after laser processing.
Figure 5:
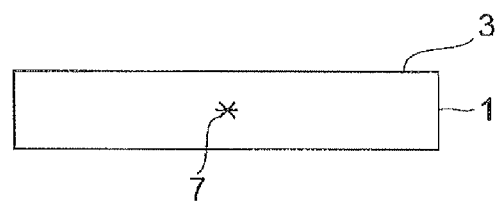
FIG. 5 is a sectional view of the object taken along the line V-V of FIG. 4.
Figure 6:
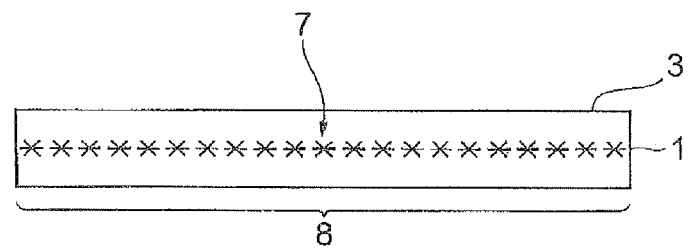
FIG. 6 is a sectional view of the object taken along the line VI-VI of FIG. 4.

Employed as the object 1 is a planar member (e.g., a substrate or a wafer), examples of which include semiconductor substrates formed of semiconductor materials and piezoelectric substrates formed of piezoelectric materials. As illustrated in FIG. 2, the line 5 for cutting the object 1 is set in the object 1. The line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 formed along the line 5 becomes a cutting start region 8.

The converging point P is a position at which the laser light L is converged. The line 5 may be curved instead of being straight, a three-dimensional one combining them, or one specified by coordinates. The line 5 may be one actually drawn on a front face 3 of the object 1 without being restricted to the virtual line. The modified region 7 may be formed either continuously or intermittently. The modified region 7 may be formed either in rows or dots and is only required to be formed at least within the object 1. There are cases where fractures are formed from the modified region 7 acting as a start point, and the fractures and modified region 7 may be exposed at outer surfaces (the front face 3, rear face 21, and outer peripheral surface) of the object 1. The laser light entrance surface for forming the modified region 7 is not limited to the front face 3 of the object 1 but may be the rear face 21 of the object 1.

Here, the laser light L is absorbed in particular in the vicinity of the converging point within the object 1 while being transmitted therethrough, whereby the modified region 7 is formed in the object 1 (i.e., internal absorption type laser processing). Therefore, the front face 3 of the object 1 hardly absorbs the laser light L and thus does not melt. In the case of forming a removing part such as a hole or groove by melting it away from the front face 3 (surface absorption type laser processing), the processing region gradually progresses from the front face 3 side to the rear face side in general.

By the modified region 7 formed in this embodiment are meant regions whose physical characteristics such as density, refractive index, and mechanical strength have attained states different from those of their surroundings. Examples of the modified region 7 include molten processed regions (meaning at least one of regions resolidified after having being once molten, those in the molten state, and those in the process of resolidifying from the molten state), crack regions, dielectric breakdown regions, refractive index changed regions, and their mixed regions. Other examples of the modified region include areas where the density of the modified region has changed from that of an unmodified region and areas formed with a lattice defect in a material of the object (which may also collectively be referred to as high-density transitional regions).

The molten processed regions, refractive index changed regions, areas where the modified region has a density different from that of the unmodified region, or areas formed with a lattice defect may further incorporate a fracture (cut or microcrack) therewithin or at an interface between the modified and unmodified regions. The incorporated fracture may be formed over the whole surface of the modified region or in only a part or a plurality of parts thereof. Examples of the object 1 include those containing or made of silicon (Si), glass, silicon carbide (SiC), $LiTaO_3$, and sapphire ($Al_2O_3$).

This embodiment forms a plurality of modified spots (processing scars) along the line 5, thereby producing the modified region 7. The modified spots, each of which is a modified part formed by a shot of one pulse of pulsed laser light (i.e., one pulse of laser irradiation; laser shot), gather to yield the modified region 7. Examples of the modified spots include crack spots, molten processed spots, refractive index changed spots, and those in which at least one of them is mixed. As for the modified spots, their size and lengths of fractures occurring therefrom can be controlled as necessary in view of the required cutting accuracy, the demanded flatness of cut surfaces, the thickness, kind, and crystal orientation of the object, and the like.

The first embodiment, which is also a premise for one aspect of the present invention, will now be explained in detail.

Figure 7:
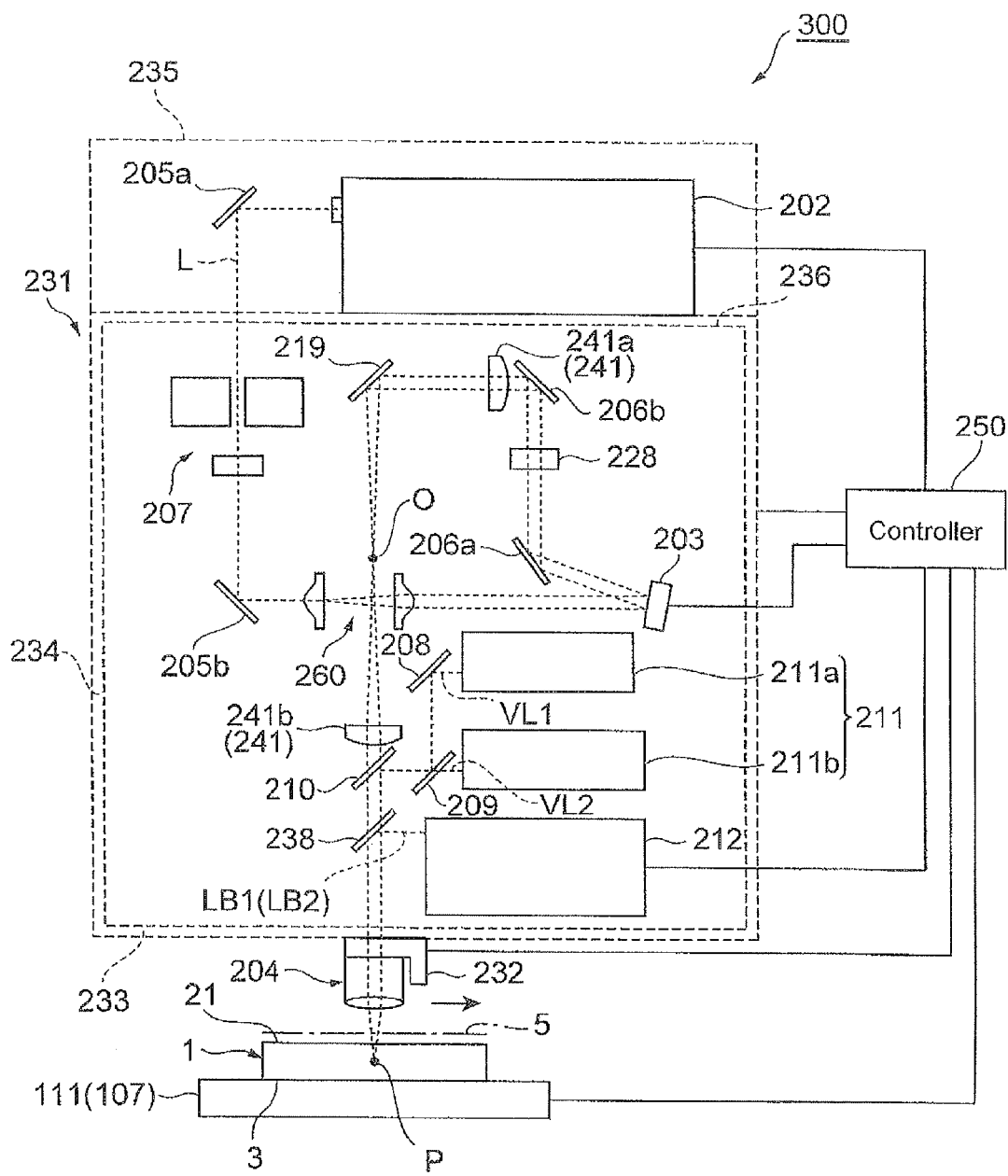
FIG. 7 is a schematic structural diagram illustrating the performing laser processing device in accordance with an embodiment.

FIG. 7 is a schematic structural diagram illustrating a laser processing device for performing the laser processing method in accordance with this embodiment. As illustrated in FIG. 7, the laser processing device 300 of this embodiment comprises a laser light source 202, a reflective spatial light modulator 203, a 4f optical system 241, and a converging optical system 204 within a housing 231. The laser light source 202, which emits laser light L having a wavelength of 1080 nm to 1200 nm, for example, uses a fiber laser, for instance. Here, the laser light source 202 is secured to a top plate 236 of the housing 231 with a screw and the like so as to emit the laser light L horizontally.

The reflective spatial light modulator 203, for which a reflective liquid crystal (LCOS: Liquid Crystal on Silicon) spatial light modulator (SLM) is used, for example, modulates the laser light L emitted from the laser light source 202. Here, the reflective spatial light modulator 203 modulates the laser light L horizontally incident thereon, while reflecting it obliquely upward with respect to the horizontal direction.

Figure 8:
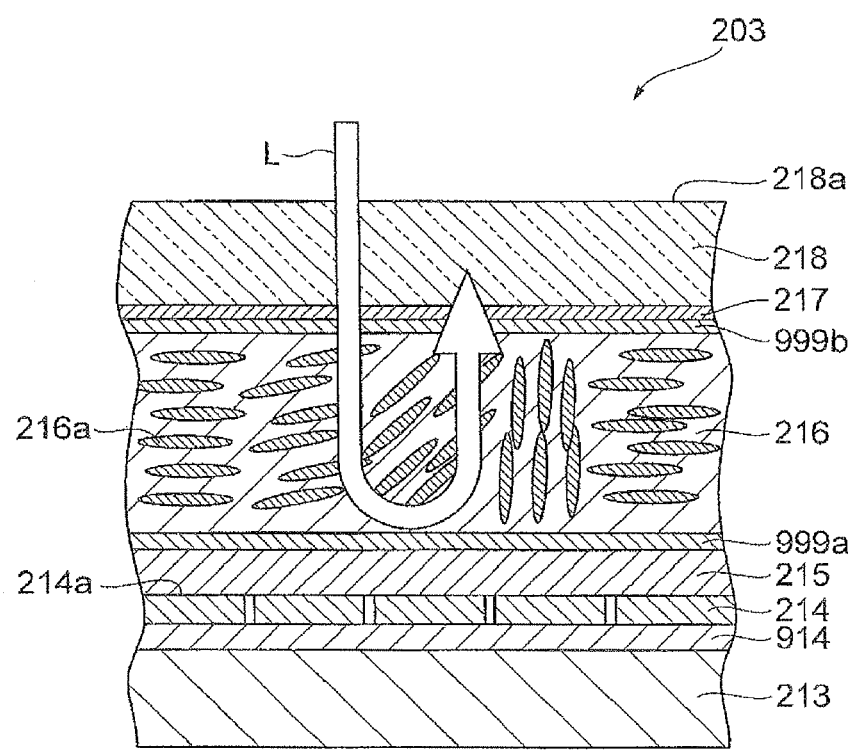
FIG. 8 is a partial sectional view of a reflective spatial light modulator.
Figure 8:
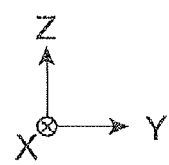

FIG. 8 is a partial sectional view of the reflective spatial light modulator in the laser processing device of FIG. 7. As illustrated in FIG. 8, the reflective spatial light modulator 203 comprises a silicon substrate 213, a drive circuit layer 914, a plurality of pixel electrodes 214, a reflecting film 215 such as a dielectric multilayer mirror, an alignment film 999a, a liquid crystal layer (display part) 216, an alignment film 999b, a transparent conductive film 217, and a transparent substrate 218 such as a glass substrate, which are stacked in this order.

The transparent substrate 218 has a front face 218a extending along an XY plane, while the front face 218a constitutes a front face of the reflective spatial light modulator 203. The transparent substrate 218 is mainly composed of a light-transmitting material such as glass, for example, and transmits therethrough the laser light L having a predetermined wavelength incident thereon from the front face 218a of the reflective spatial light modulator 203 to the inside of the latter. The transparent conductive film 217 is formed on a rear face of the transparent substrate 218 and mainly composed of a conductive material (e.g., ITO) which transmits therethrough the laser light L.

The plurality of pixel electrodes 214 are arranged two-dimensionally according to the arrangement of a plurality of pixels on the silicon substrate 213 along the transparent conductive film 217. Each pixel electrode 214 is made of a metal material such as aluminum, for example, while its front face 214a is processed flat and smooth. The plurality of pixel electrodes 214 are driven by an active matrix circuit provided in the drive circuit layer 914.

The active matrix circuit is disposed between the plurality of pixel electrodes 214 and the silicon substrate 213 and controls the voltage applied to the pixel electrodes 214 according to a light image to be outputted from the reflective spatial light modulator 203. An example of such an active matrix circuit has a first driver circuit for controlling pixel rows each aligning in the X direction and a second driver circuit for controlling pixel columns each aligning in the Y direction, which are not depicted, and is constructed such that a controller 250 (which will be explained later) applies a predetermined voltage to the pixel electrode 214 of a pixel specified by both of the driver circuits.

The alignment films 999a, 999b are arranged on both end faces of the liquid crystal layer 216, respectively, so as to align a group of liquid crystal molecules in a fixed direction. As the alignment films 999a, 999b, those made of a polymer material such as polyimide, whose surfaces coming into contact with the liquid crystal layer 216 have been subjected to rubbing, for example, are employed.

The liquid crystal layer 216 is arranged between the plurality of pixel electrodes 214 and the transparent conductive film 217 and modulates the laser light L according to an electric field formed between each pixel electrode 214 and the transparent conductive film 217. That is, when the active matrix circuit applies a voltage to a given pixel electrode 214, an electric field is formed between the transparent conductive film 217 and this pixel electrode 214.

The electric field is applied to the reflecting film 215 and the liquid crystal layer 216 at a ratio of their respective thicknesses. The alignment direction of liquid crystal molecules 216a changes according to the magnitude of the electric field applied to the liquid crystal layer 216. The laser light L entering the liquid crystal layer 216 through the transparent substrate 218 and transparent conductive film 217, if any, is modulated by the liquid crystal molecules 216a while passing through the liquid crystal layer 216, then reflected by the reflecting film 215, and thereafter modulated again by the liquid crystal layer 216 before being taken out.

At this time, the controller 250, which will be explained later, applies a voltage to each of the pixel electrodes 214 opposing the transparent conductive film 217, whereby the refractive index in a part held between the transparent conductor film 217 and each of its opposing pixel electrodes 214 changes (the refractive index of the liquid crystal layer 216 at a position corresponding to each pixel changes). Such a change in refractive index can alter the phase of the laser light L for each pixel of the liquid crystal layer 216 according to the voltage applied. That is, a phase modulation corresponding to a hologram pattern can be imparted to the liquid crystal layer 216 for each pixel (i.e., the liquid crystal layer 216 of the reflective spatial light modulator 203 can be caused to display a modulation pattern as a hologram pattern providing a modulation).

As a result, the wavefront of the laser light L incident on and transmitted through the modulation pattern is adjusted, so that individual rays constituting the laser light L vary in phases of components in a predetermined direction orthogonal to their advancing direction. Therefore, appropriately setting the modulation pattern displayed in the reflective spatial light modulator 203 can modulate the laser light L (in terms of its intensity, amplitude, phase, and polarization, for example).

Figure 11:
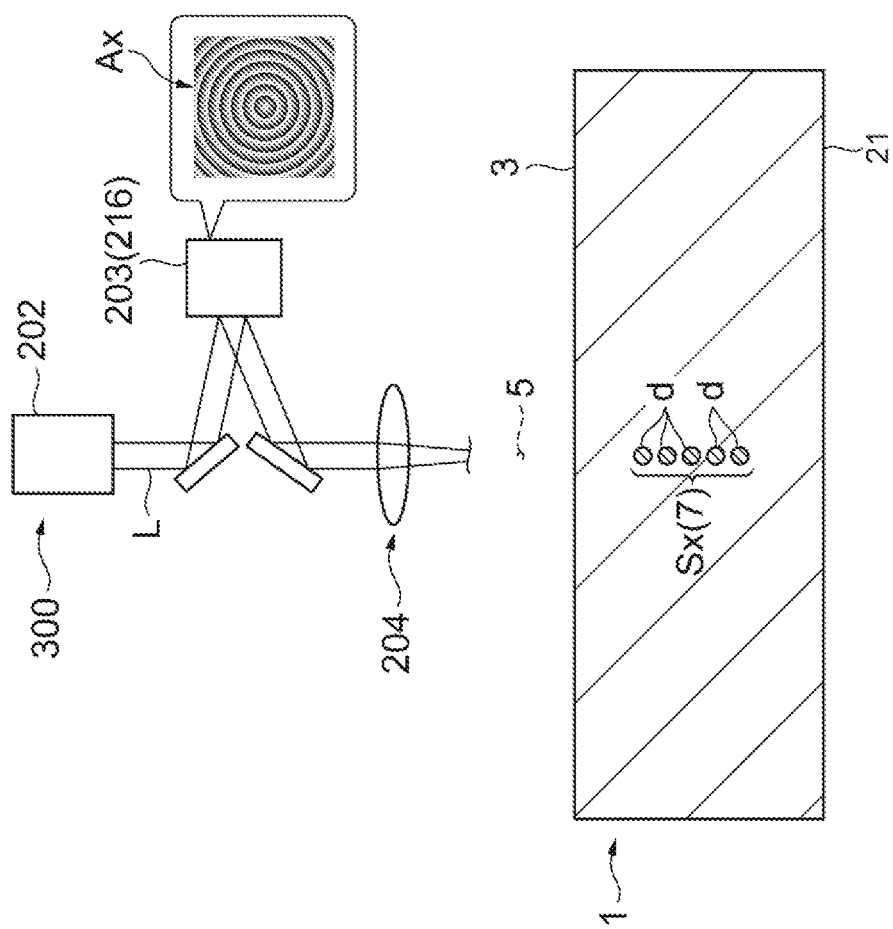
FIG. 11 is a schematic sectional view for explaining the laser processing method in accordance with a first embodiment.

As will be explained later, the reflective spatial light modulator 203 of this embodiment displays an axicon lens pattern as a modulation pattern in the liquid crystal layer 216, thereby modulating the laser light L, with which the object 1 is irradiated, such that the laser light L is converged at the object 1 so as to form converging points at a plurality of positions juxtaposed close to each other along the laser light irradiation direction. This forms, as illustrated in FIG. 11, modified dots d at the plurality of positions, respectively.

The plurality of modified dots d constitute one modified spot Sx to become a multipoint long modified spot. The modified spot Sx is elongated in the laser light irradiation direction (vertically long) as compared with a modified spot subjected to laser processing without displaying modulation patterns in the liquid crystal layer 216. That is, the plurality of modified dots d are densely juxtaposed close to each other in a row along the laser light irradiation direction, while the modified spot Sx formed by a series of the plurality of modified dots d has an elongated form which is longer in the laser light irradiation direction than in directions intersecting the former direction.

Returning to FIG. 7, the 4f optical system 241 adjusts the wavefront form of the laser light L modulated by the reflective spatial light modulator 203. The 4f optical system 241 has first and second lenses 241a, 241b. The lenses 241a, 241b are arranged between the reflective spatial light modulator 203 and the converging optical system 204 such that the distance between the reflective spatial light modulator 203 and the first lens 241a equals the focal length f1 of the first lens 241a, the distance between the converging optical system 204 and the second lens 241b equals the focal length f2 of the lens 241b, the distance between the first and second lenses 241a, 241b equals f1+f2, and the first and second lenses 241a, 241b constitute a double-telecentric optical system. This 4f optical system 241 can inhibit the laser light L modulated by the reflective spatial light modulator 203 from changing its wavefront form through spatial propagation and thereby increasing aberrations.

The converging optical system 204 converges the laser light L modulated by the 4f optical system 241 into the object 1. The converging optical system 204, which includes a plurality of lenses, is placed on a bottom plate 233 of the housing 231 while interposing therebetween a drive unit 232 including a piezoelectric device and the like.

In the laser processing device 300 constructed as in the foregoing, the laser light L emitted from the laser light source 202 advances horizontally within the housing 231 and then is reflected downward by a mirror 205a, whereupon its light intensity is adjusted by an attenuator 207. Then, the laser light L is reflected horizontally by a mirror 205b and, with its intensity distribution (hereinafter simply referred to as "intensity distribution") homogenized by a beam homogenizer 260, enters the reflective spatial light modulator 203.

The laser light L having entered the reflective spatial light modulator 203 passes through the modulation pattern displayed in the liquid crystal layer 216, so as to be modulated according to the modulation pattern, then is reflected upward by a mirror 206a, changes its polarization direction with a half-wave plate 228, and is horizontally reflected by a mirror 206b, so as to enter the 4f optical system 241.

The laser light L having entered the 4f optical system 241 has its wavefront form adjusted so as to be incident as parallel light on the converging optical system 204. Specifically, the laser light L converges by passing through the first lens 241a, is reflected downward by a mirror 219, diverges at a confocal point O, and passes through the second lens 241b, so as to be converged again to become parallel light. Then, the laser light L passes through dichroic mirrors 210, 238 in sequence, so as to enter the converging optical system 204, thereby being converged into the object 1 mounted on the stage 111.

The laser processing device 300 of this embodiment also comprises, within the housing 231, a surface observation unit 211 for observing the laser light entrance surface of the object 1 and an AF (AutoFocus) unit 212 for finely adjusting the distance between the converging optical system 204 and the object 1.

The surface observation unit 211 has an observation light source 211a for emitting visible light VL1 and a detector 211b for receiving and detecting reflected light VL2 of the visible light VL1 reflected by the laser light entrance surface of the object 1. In the surface observation unit 211, the visible light VL1 emitted from the observation light source 211a is reflected by or transmitted through a mirror 208 and dichroic mirrors 209, 210, 238, so as to be converged by the converging optical system 204 to the object 1. The reflected light VL2 reflected by the laser light entrance surface of the object 1 is converged by the converging optical system 204, so as to be transmitted through or reflected by the dichroic mirrors 238, 210, and then transmitted through the dichroic mirror 209, so as to be received by the detector 211*b*.

The AF unit 212 emits AF laser light LB1 and receives and detects reflected light LB2 of the AF laser light LB1 reflected by the laser light entrance surface of the object 1, thereby acquiring displacement data of the laser light entrance surface along the line 5. Then, when forming the modified region 7, the AF unit 212 drives the drive unit 232 according to thus obtained displacement data, so as to move the converging optical system 204 to and fro in its optical axis direction along undulations of the laser light entrance surface of the object 1.

The laser processing device 300 further comprises the controller 250, constituted by CPU, ROM, RAM, and the like, for controlling the laser processing device 300. The controller 250 controls the laser light source 202, so as to adjust the output, pulse width, and the like of the laser light L emitted from the laser light source 202. When forming the modified region 7, the controller 250 controls at least one of the positions of the housing 231 and stage 111 and the driving of the drive unit 232 so that the converging point P of the laser light L relatively moves along the line 5 while being located at a predetermined distance from the front face 3 of the object 1.

When forming the modified region 7, the controller 250 applies a predetermined voltage to each electrode 214 in the reflective spatial light modulator 203, so as to cause the liquid crystal layer 216 to display a predetermined modulation pattern, thereby enabling the reflective spatial light modulator 203 to modulate the laser light L as desired.

Here, the modulation pattern displayed in the liquid crystal layer 216 is derived beforehand from the position to be formed with the modified region 7, the wavelength of the laser light L emitted, the material of the object 1, refractive indexes of the converging optical system 204 and object 1, and the like and stored in the controller 250. This modulation pattern includes at least one of an individual difference correction pattern for correcting individual differences occurring in the laser processing device 300 (e.g., distortions occurring in the liquid crystal layer 216 of the reflective spatial light modulator 203), a spherical aberration correction pattern for correcting a spherical aberration, and an axicon lens pattern.

Figure 9:
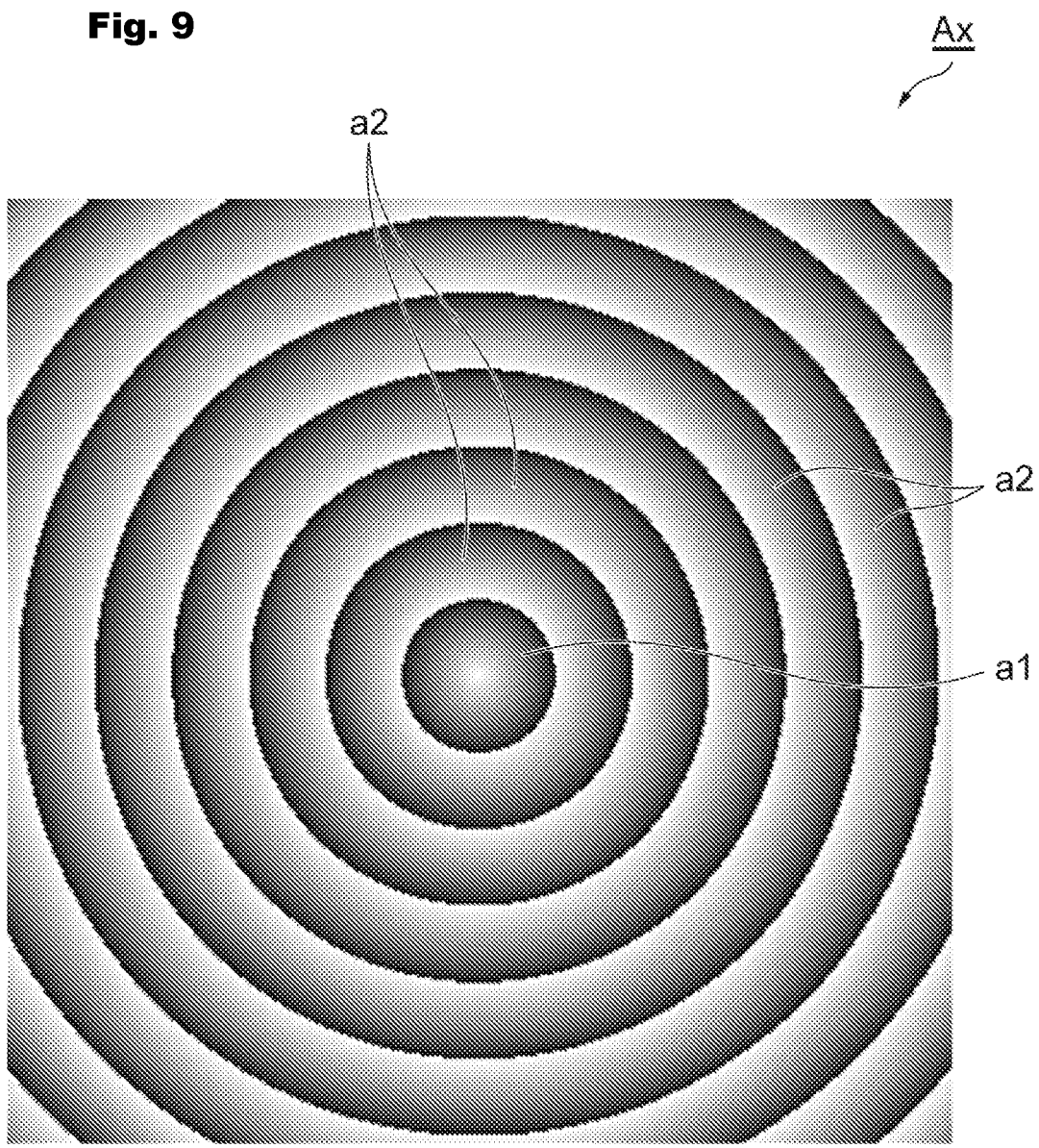
FIG. 9 is a diagram illustrating an axicon lens pattern displayed in a liquid crystal layer of the reflective spatial light modulator.

FIG. 9 is a diagram illustrating an axicon lens pattern displayed in the liquid crystal layer. The depicted axicon lens pattern Ax shows a state of the liquid crystal layer 216 in its front view. As illustrated in FIG. 9, the axicon lens pattern Ax is a modulation pattern generated so as to achieve an action of an axicon lens. The axicon lens pattern Ax converges the laser light L at the object 1 such that converging points are formed at a plurality of positions juxtaposed close to each other along the laser light irradiation direction. In other words, the laser light L is modulated so as to have a plurality of intensity distributions in the laser light irradiation direction. Here, the axicon lens pattern Ax is an inverted conical optical pattern which is downward convex.

Specifically, the axicon lens pattern Ax has a circular region a1 located at the center with respect to the incident laser light L and a plurality of circular ring regions a2 demarcated about the circular region a1. The circular ring regions 2*a* are formed concentrically with the circular region a1 and have circular ring forms with or without partial cutouts. The circular region a1 and plurality of circular ring regions a2 are configured such as to increase brightness gradually from their radially outer sides to inner sides.

When performing laser processing while causing the liquid crystal layer 216 to display the axicon lens pattern Ax, the number of converging points (number of modified dots d) juxtaposed close to each other along the laser light irradiation direction increases with a parameter number which is the number of circular ring regions a2 (the number of turns of brightness from the center), thereby forming the vertically long modified spot Sx corresponding to the parameter number. Here, as the parameter number increases and decreases, the number of modified dots d increases and decreases on the front side of (on the upstream side of) the laser light L, whereby the resulting modified spot Sx tends to expand and contract on the front side of the laser light L.

A laser processing method using the above-mentioned laser processing device 300 will now be explained in detail.

Figure 10:
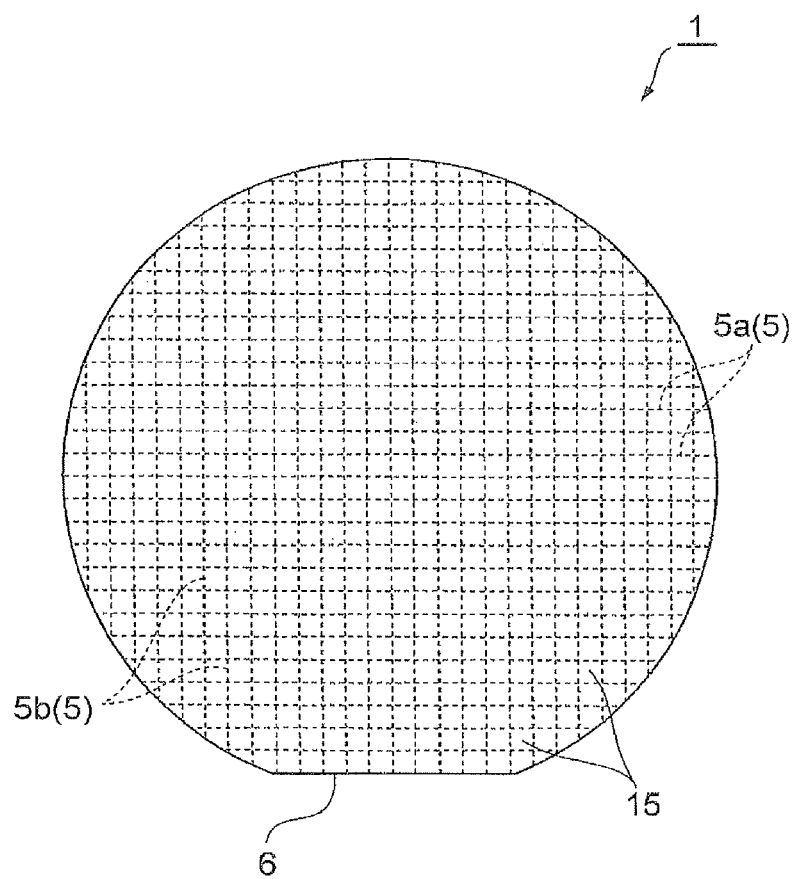
FIG. 10 is a plan view illustrating the object to be subjected to laser processing.

FIG. 10 is a plan view illustrating the object to be subjected to laser processing in accordance with this embodiment, while FIG. 11 is a sectional view for explaining the laser processing method in this embodiment. The laser processing method of this embodiment is used as a chip manufacturing method for manufacturing a plurality of chips by laser-processing the object 1. As illustrated in FIG. 10, the object 1, examples of which include silicon substrates, sapphire substrates, SiC substrates, glass substrates (tempered glass substrates), semiconductor substrates, and transparent insulated substrates, has a planar form. The thickness of the object 1, which may be 150 μm to 350 μm, is 200 μm or 250 μm here.

The front face 3 of the object 1 is provided with a plurality of functional device formation regions 15 arranged in a matrix. A plurality of lines to cut 5 extending so as to pass between the functional device formation regions 15 adjacent to each other are set on the front face 3 of the object 1. The plurality of lines 5 extend like grids and include lines to cut 5*a*, 5*b* which extend along directions substantially parallel and perpendicular to an orientation flat 6 of the object 1, respectively. When the object 1 is a sapphire substrate, its c-plane is taken as principal surfaces (the front face 3 and rear face 21), and the lines 5 are configured so as to extend in directions along the r-plane of the sapphire substrate.

First, when laser-processing the object 1, an expandable tape is attached to the rear face 21 of the object 1, and the object 1 is mounted on the stage 111. Subsequently, as illustrated in FIGS. 7 and 11, the controller 250 controls the reflective spatial light modulator 203, so as to cause the liquid crystal layer 216 to display the axicon lens pattern Ax as a modulation pattern, whereupon the object 1 is irradiated with the laser light L in a pulsating manner while using the front face 3 of the object 1 as a laser light entrance surface (laser light irradiation surface) and converging the laser light L at the object 1 so as to form converging points at a plurality of positions juxtaposed close to each other along the laser light irradiation direction. At the same time, the object 1 and the laser light L are relatively moved (scanned) along the lines 5.

This forms a plurality of vertically long modified spots Sx, each having modified dots d formed at a plurality of positions juxtaposed close to each other along the laser light irradiation direction, along the lines 5 at a predetermined depth in the thickness direction of the object 1. The plurality of modified spots Sx form the modified region 7.

Thereafter, the expandable tape is expanded, so as to cut the object 1 along the lines 5 from the modified region 7 acting as a cutting start point, whereby a plurality of cut chips are obtained as semiconductor devices (examples of which include memories, IC, light-emitting devices, and light-receiving devices).

When forming the modified spot Sx, the following axicon lens pattern production step (axicon lens pattern production control) may be performed. In the axicon lens pattern production step, the controller 250 produces the axicon lens pattern Ax, for example, according to a state of a normal modified spot formed within the object 1 without causing the liquid crystal layer 216 to display the modulation pattern (which may simply be referred to as "normal modified spot" in the following).

There are cases where the modified spot Sx varies its length in the laser light irradiation direction depending on the material of the object 1 and the energy of the laser light L, thereby changing its position in the thickness direction. Therefore, the following converging point position correction step (converging point position correction control) may be performed when forming the modified spot Sx.

With reference to the deepest position (position closest to the rear face 21) of the laser light L concerning the modified spot Sx to be formed, the converging point position correction step corrects the converging point position (Z height) of the laser light in the thickness direction according to the state of the normal modified spot, for example. This is because the modified spot Sx tends to expand and contract on the front side of the laser light L according to the parameter number.

When forming the modified spot Sx, an axicon lens pattern adjustment step (axicon lens pattern adjustment control) for adjusting the parameter number of the axicon lens pattern Ax (the number of circular ring regions a2) may be performed. In the axicon lens pattern adjustment step, the parameter number of the axicon lens pattern Ax is set according to the state of the normal modified spot, for example, so as to correspond to the length in the laser light irradiation direction of the modified spot Sx (modified region 7) to be formed. Specifically, the parameter number is made greater and smaller when the modified spot Sx is to be formed longer and shorter in the laser light irradiation direction, respectively.

As in the foregoing, when forming the modified region 7, this embodiment can cause the reflective spatial light modulator 203 to display the axicon lens pattern Ax as a modulation pattern, thereby converging laser light so as to form converging points at a plurality of positions juxtaposed close to each other in the laser light irradiation direction. That is, the longitudinally fine multipoint-diverged laser light L can perform laser processing (so-called simultaneous multipoint elongation processing), so as to connect the diverged multipoint converging points to each other, thereby forming a pseudo vertically long converging spot. This can form the modified spot Sx having a plurality of modified dots d juxtaposed close to each other in the laser light irradiation direction.

This modified spot Sx forms a simulatively (and substantially) vertically long converging part while fully keeping its energy density, thereby producing the vertically long modified region 7. This can reduce the number of fractures occurring within the object 1 and make the fractures harder to extend. As a result, it becomes possible to ameliorate the straightness in cut sections and the bending strength, thereby improving the processing quality.

The modified region 7 becomes vertically long and thus can improve throughput. This embodiment can reduce the number of fractures and thus is effective in particular when the fractures within the object 1 are to be controlled (e.g., when the lines 5 do not align with the crystal orientation or when a glass material is to be processed).

The above-mentioned operation and effect that it can reduce the amount of fractures is remarkably effective in decreasing fractures in the c-plane direction when the object 1 is an SiC substrate or sapphire substrate. While an optical system using an axicon lens to make converging points vertically long typically lowers the energy density so that normal processing is difficult or a large amount of energy is necessary for processing, this embodiment can converge the laser light L while fully keeping the energy density as mentioned above. Since the spatial phase modulator 203 is used for forming the vertically long modified spot Sx, the modified region 7 can instantaneously be formed with a given pitch at a given position.

When the object 1 is a sapphire substrate taking the c-plane as a principal surface, fractures are typically hard to extend along the r-plane in the sapphire substrate. Therefore, when the modified region 7 is formed along the line 5 extending along the r-plane, resulting fractures are easy to extend in directions intersecting the line 5, thereby yielding a fear of breaking along directions intersecting the line 5. By contrast, this embodiment can reduce the amount of fractures and thus can suppress the fear, thereby being effective in particular when the line 5 is set so as to extend in a direction along the r-plane of the sapphire substrate.

Figure 12:
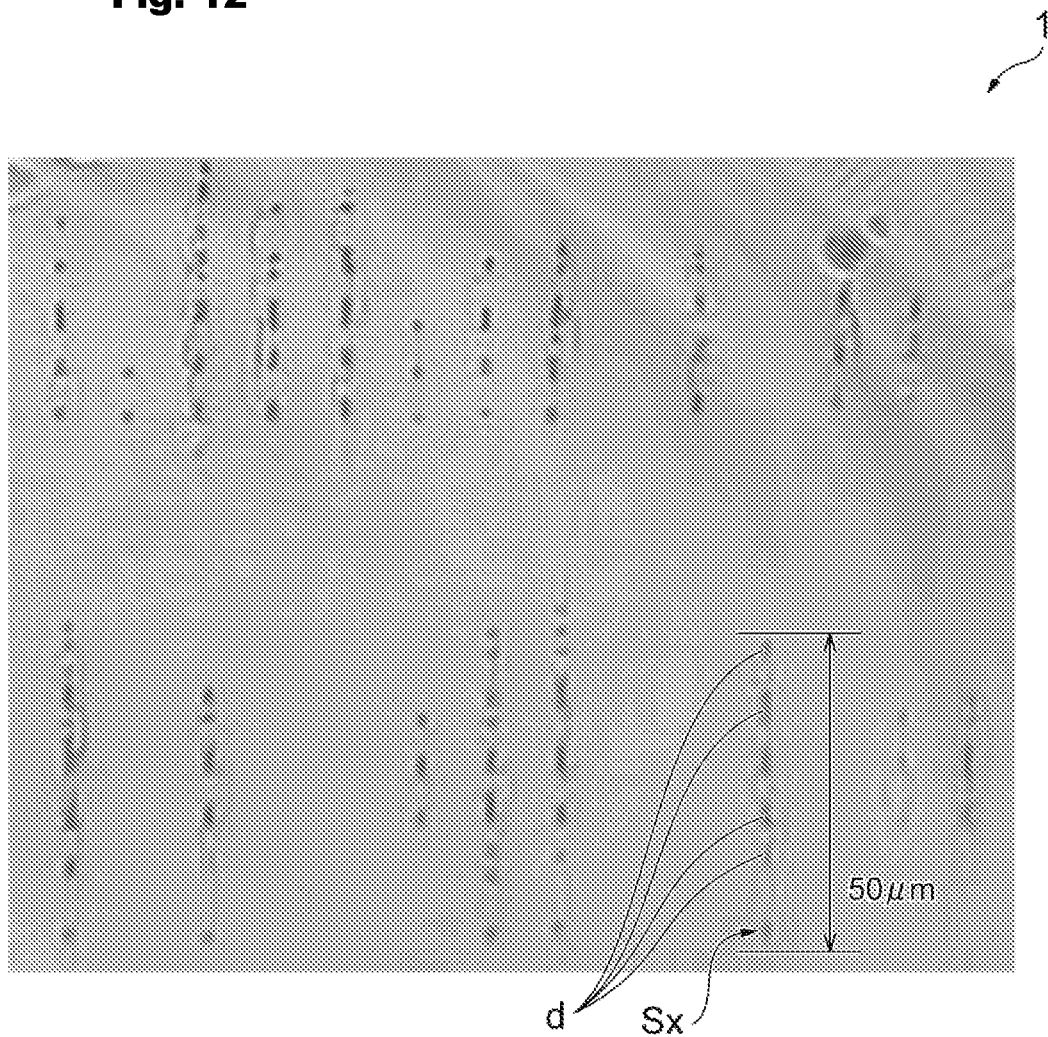
FIG. 12 is a photograph illustrating an example of modified spots formed by the laser processing method in accordance with the first embodiment.

FIG. 12 is a photograph illustrating an example of modified spots formed by the laser processing method of this embodiment. FIG. 12 illustrates the object 1 as seen from a side, while the depicted vertical direction corresponds to the thickness direction. It can be seen from FIG. 12 that converging points are formed at a plurality of positions juxtaposed close to each other in the laser light irradiation direction, whereby the vertically long modified spot Sx having a plurality of modified dots d juxtaposed close to each other in the laser light irradiation direction is made.

Figure 13:
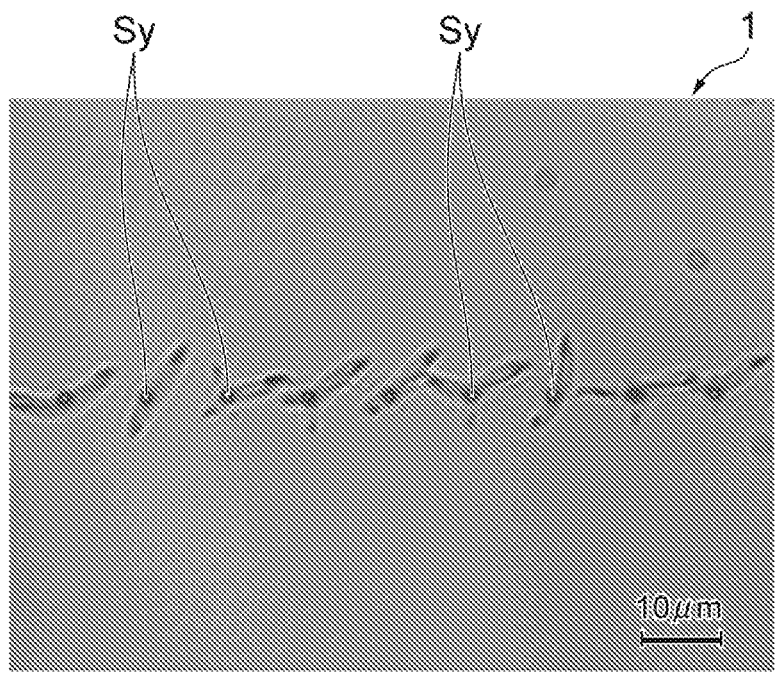
FIG. 13 is a photograph for explaining effects of the laser processing method in accordance with the first embodiment.
Figure 13:
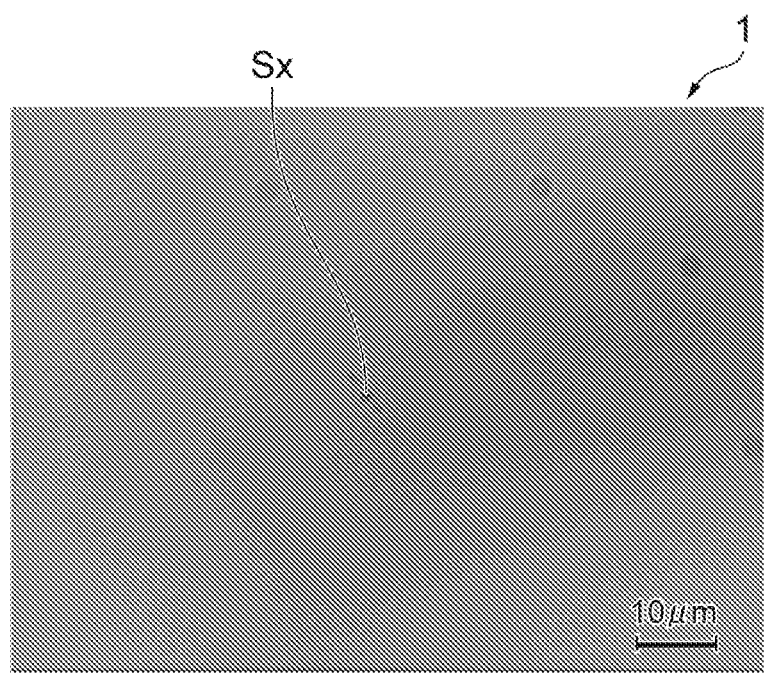

FIG. 13 is a photograph for explaining effects of the laser processing method of this embodiment. FIG. 13($a$) is a picture in which the object 1 is irradiated with the laser light L while no modulation pattern is displayed in the liquid crystal layer 216, so as to form modified spots Sy within the object 1. FIG. 13($b$) is a picture in which the object 1 is irradiated with the laser light L while the axicon lens pattern Ax is displayed in the liquid crystal layer 216, so as to form the modified spot Sx within the object 1. The pictures in FIG. 13 illustrate the inside of the object 1 formed with the modified spots as seen from the laser light-entrance surface.

It can be seen from FIG. 13 that the vertically long modified spot Sx formed while the axicon lens pattern Ax is displayed in the liquid crystal layer 216 can reduce the amount of fractures occurring within the object 1 as compared with the modified spots Sy formed while no modulation pattern is displayed in the liquid crystal layer 216.

Figure 14:
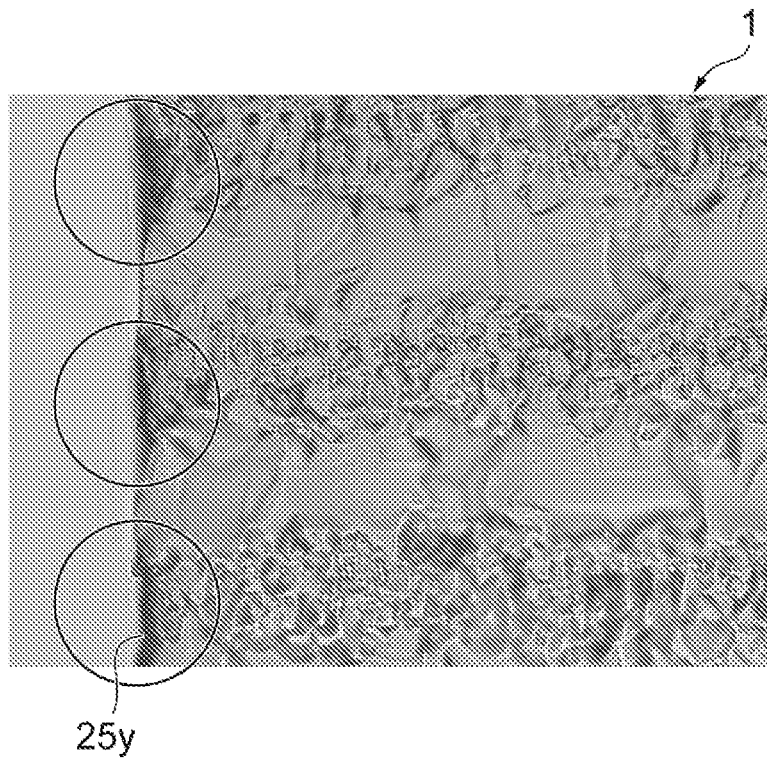
FIG. 14 is another photograph for explaining effects of the laser processing method in accordance with the first embodiment.
Figure 14:
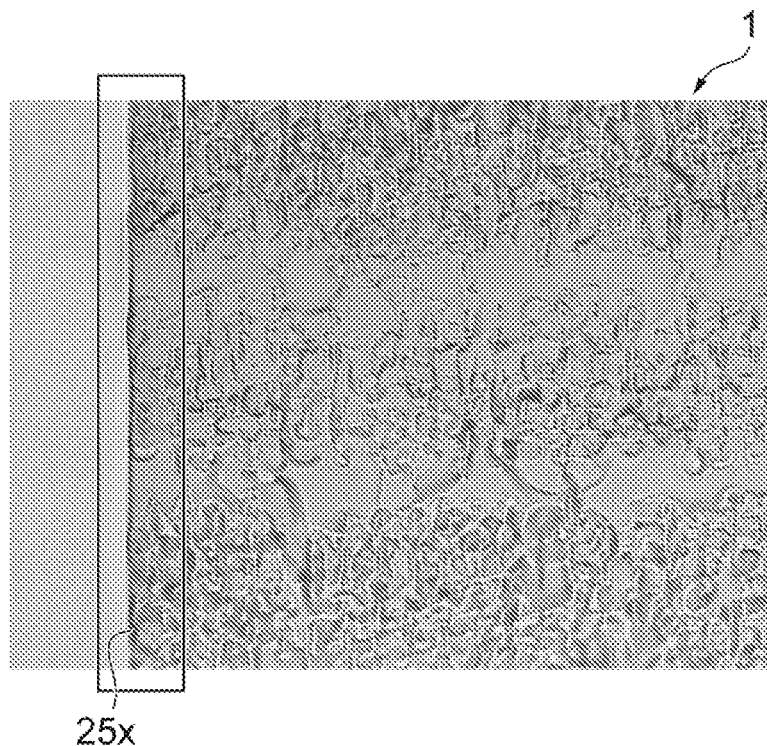

FIG. 14 is another photograph for explaining effects of the laser processing method of this embodiment. FIG. 14($a$) illustrates a cut section 25$y$ at the time when the object 1 is irradiated with the laser light L while no modulation pattern is displayed in the liquid crystal layer 216. FIG. 14($b$) illustrates a cut section 25$x$ at the time when the object 1 is irradiated with the laser light L while the axicon lens pattern Ax is displayed in the liquid crystal layer 216. FIG. 14 illustrates the object 1 as seen from a side, while the depicted vertical direction corresponds to the thickness direction.

It can be seen from FIG. 14 that laser processing with the axicon lens pattern Ax tends to reduce fractures extending in directions intersecting the thickness direction, for example, in particular, whereby the straightness at chip end faces improves in the cut section 25$x$ as compared with that in the cut section 25$y$ formed by laser processing without displaying modulation patterns in the liquid crystal layer 216.

The following will illustrate results of measurement of bending strength concerning a chip produced by laser-processing the object 1 without displaying modulation patterns in the liquid crystal layer 216 and a chip produced by laser-processing the object 1 while displaying the axicon lens pattern Ax in the liquid crystal layer 216. Here, a load is exerted on the laser light entrance surface side.

Displaying no modulation pattern: bending strength 75.3 MPa

Displaying the axicon lens pattern: bending strength 109.6 MPa

It can be seen from the above-mentioned bending strength measurement results that laser processing with the axicon lens pattern Ax improves the bending strength of the chip as compared with the laser processing without displaying modulation patterns in the liquid crystal layer 216.

Since converging points are formed at a plurality of positions juxtaposed close to each other in the optical axis direction (a vertically long multipoint converging point is formed), the following operations and effects are exhibited. The modified region 7 is formed like a perforation, which makes it easier to cut the object 1 along the modified region 7. This easily enables laser processing independent of the cleavage characteristic and crystal orientation. It also allows laser processing to be performed with an amount of energy smaller than that in the case of converging at a single vertically long converging spot, thereby making it easier to secure a sufficient energy density even when forming the modified region 7 within the object 1 at a position which is deep from the laser light entrance surface, so that the modified region 7 having a sufficient size (large width) can be formed.

With respect to one converging point, another converging point is located nearby in the optical axis direction, so as to enhance the destructive force in the object 1 at the time of cutting, whereby the object 1 can be cut easily. The latter converging point also brings a heat-inducing effect to the former converging point, whereby the object 1 can be cut easily. This can further enhance a destressing effect at the time when the laser light L modifies the object 1, whereby the object 1 can be cut easily.

The second embodiment will now be explained in detail. This embodiment will be explained mainly in terms of differences from the above-mentioned first embodiment.

Figure 15:
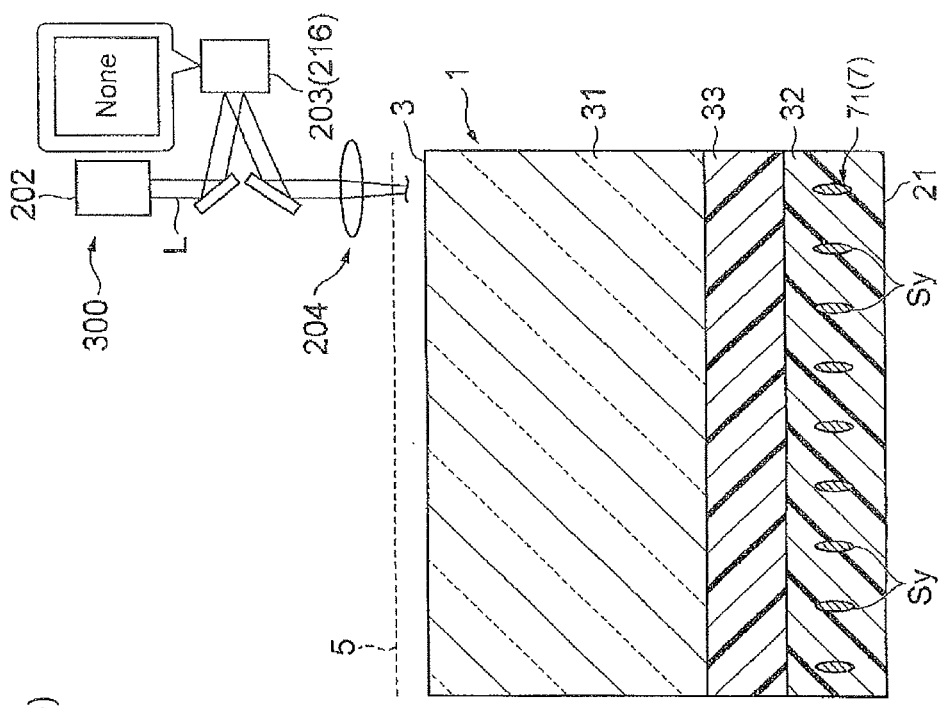
FIG. 15 is a schematic sectional view for explaining the laser processing method in accordance with a second embodiment.
Figure 15:
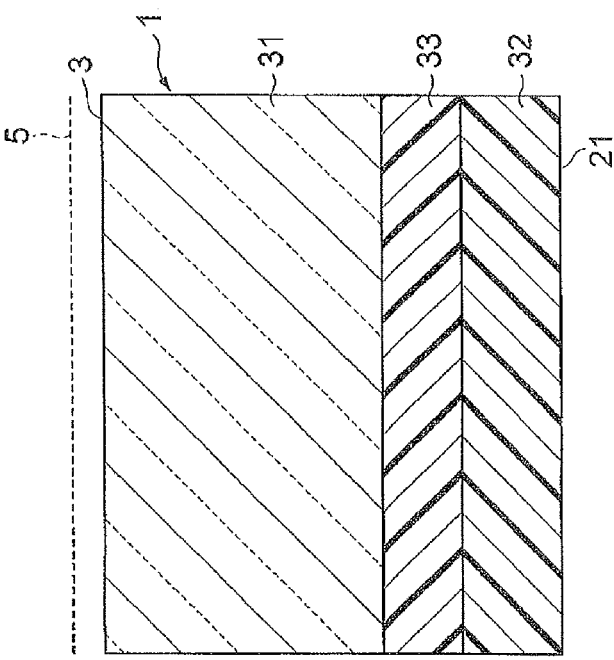

FIGS. 15 and 16 are sectional views for explaining the laser processing method in this embodiment. As illustrated in FIG. 15(a), this embodiment manufactures a chip used as a device such as an image sensor. The object 1 to be subjected to laser processing in this embodiment is one in which a silicon substrate (silicon part) 32 containing silicon is mounted on a glass substrate (glass part) 31 containing glass with a resin layer (resin part) 33 interposed therebetween.

In the illustrated example, the object 1 has the silicon substrate 32, the resin layer 33 disposed on the front face of the silicon substrate 32, and the glass substrate 31 disposed on the front face of the resin layer 33 and is formed by joining the glass substrate 31 and silicon substrate 32 together with a resin of the resin layer 33. The glass substrate 31 has a thickness greater than that of the silicon substrate 32. Here, the front face of the glass substrate 31 and the rear face of the silicon substrate 32 constitute the front face 3 and rear face 21 of the object 1, respectively.

In this embodiment, as illustrated in FIG. 15(b), the controller 250 controls the reflective spatial light modulator 203 at first so that no modulation pattern is displayed in the liquid crystal layer 216. In this state, the object 1 is irradiated with the laser light L in a pulsating manner from the front face 3 such that a converging point is located within the silicon substrate 32 of the object 1, while the object 1 and the laser light L are moved relative to each other along the line 5. As a result, a plurality of normal modified spots Sy are formed within the silicon substrate 32 along the line 5, and the plurality of modified spots Sy form one row of a modified region $7_1$.

Subsequently, as illustrated in FIG. 16(a), the controller 250 controls the reflective spatial light modulator 203, so as to cause the liquid crystal layer 216 to display the axicon lens pattern Ax. In this state, the object 1 is irradiated with the laser light L in a pulsating manner from the front face 3 such that a converging point is located within the resin layer 33 in the object 1. This converges the laser light L at the object 1 such that converging points are formed at a plurality of positions juxtaposed close to each other along the laser light irradiation direction within the resin layer 33. At the same time, the object 1 and the laser light L are moved relative to each other along the line 5.

As a result, a plurality of vertically long modified spots Sx each having modified dots d formed at a plurality of positions juxtaposed close to each other along the laser light irradiation direction are produced along the line 5 within the resin layer 33, and the plurality of modified spots Sx form one row of a modified region $7_2$.

Next, as illustrated in FIG. 16(b), the controller 250 controls the reflective spatial light modulator 203 such that the axicon lens pattern Ax is still displayed in the liquid crystal layer 216. In this state, the object 1 is irradiated with the laser light L in a pulsating manner from the front face 3 such that a converging point is located within the glass substrate 31 of the object 1. This converges the laser light L at the object 1 such that converging points are formed within the resin layer 33 at a plurality of positions juxtaposed close to each other along the laser light irradiation direction. Here, the laser light L is converged in the object 1 in a part on the silicon part 32 side from a center in the laser light irradiation direction within the glass substrate 31. (a region indicated by arrow Z in the drawing).

At the same time, the object 1 and the laser light L are moved relative to each other along the line 5. As a result, a plurality of vertically long modified spots Sx each having modified dots d formed at a plurality of positions juxtaposed close to each other along the laser light irradiation direction are produced along the line 5, and the plurality of modified spots Sx form one row of a modified region $7_3$.

Thereafter, a knife edge, for example, is pressed along the line 5. In other words, after forming the modified region $7_3$ in the glass substrate 31, a step of applying a stress to the object 1 so as to cut the object 1 along the line 5 is performed. This can cut the object 1. along the line 5 from the modified regions $7_1$ to $7_3$ acting as cutting start points, thereby yielding a plurality of chips.

As in the foregoing, by causing the reflective spatial light modulator 203 to display the axicon lens pattern Ax as a modulation pattern, this embodiment can converge the laser light L at the glass substrate 31 so as to form converging points at a plurality of positions juxtaposed close to each other along the laser light irradiation direction. This forms the pseudo vertically long modified spots Sx while fully keeping their energy density, thereby producing the vertically long modified regions $7_3$ in the glass substrate 31.

As in the above-mentioned embodiment, the modified regions $7_3$ can reduce the amount of fractures occurring within the glass substrate 31, so as to ameliorate the straightness in cut sections and the bending strength, thereby improving the processing quality. The above-mentioned operation and effect of ameliorating the straightness in cut sections is particularly effective for the glass substrate 31, which is considered to exhibit a poor straightness in cut sections in general.

As mentioned above, this embodiment controls the positions of converging points of the laser light L such that the modified regions $7_3$ are formed only in a part on the silicon substrate 32 side from a center in the thickness direction (laser light irradiation direction) of the glass substrate 31. This can improve throughput, while keeping an improvement in the processing quality, as compared with the case where the modified regions $7_3$ are formed in substantially the whole region in the thickness direction of the glass substrate 31.

As mentioned above, when laser-processing the resin layer 33, this embodiment converges the laser light L at the resin layer 33 so as to form converging points at a plurality of positions juxtaposed close to each other along the laser light irradiation direction by causing the liquid crystal layer 216 to display the axicon lens pattern Ax as a modulation pattern, thereby forming a plurality of modified spots Sx also within the resin layer 33, thus producing the vertically long modified regions $7_2$. Since the resin layer 33 is inherently hard to grow fractures, this embodiment is effective in particular, thereby yielding excellent processability.

FIG. 17 is a sectional view explaining an example of modified regions formed in a resin layer. FIG. 17 illustrates a state of the object 1 as seen from a side, while the depicted vertical direction corresponds to the thickness direction. It can be seen from. FIG. 17 that the vertically long modified spots Sx extending along the thickness direction are formed vividly when the resin layer 33 is subjected to the above-mentioned laser processing with the axicon lens pattern Ax displayed in the liquid crystal layer 216. The depicted modified spots Sx have vertically long forms extending from the front face to rear face of the resin layer 33 in the thickness direction.

The modified regions 7 are relatively easy to form in the resin layer 33, since its processing threshold is low. Therefore, the modified regions 7 may be formed in the resin layer 33 by at least one of leakage light occurring when forming the modified regions $7_1$ in the silicon substrate 32 and leakage light occurring when forming the modified regions $7_3$ in the glass substrate 31. That is, a step of converging the laser light L at the glass substrate 31 and/or silicon substrate 32 so as to cause leakage light of the laser light L to form the modified regions 7 in the resin layer 33 may be provided. In other words, the controller 250 may converge the laser light L at the glass substrate 31 and/or silicon substrate 32 so as to cause leakage light of the laser light L to form the modified regions 7 in the resin layer 33.

This embodiment may remove the part along the line 5 of the silicon substrate 32 by etching and the like without laser-processing the silicon substrate 32 (without forming the modified regions $7_1$). That is, a process of removing the part along the line 5 of the silicon substrate 32 by etching the silicon substrate 32 may be provided.

Alternatively, since the silicon substrate 32 is thinner than the glass substrate 31, and they are firmly joined together with a resin, the object 1 may be broken after laser-processing the glass substrate 31 when the silicon substrate 32 is not laser-processed, so as to divide the silicon substrate 32 together with the glass substrate 31. That is, the method may comprise a step of applying a stress to the object 1 after forming the modified regions $7_3$ in the glass substrate 31, so as to generate a fracture extending from the modified regions $7_3$ (and/or modified regions $7_2$) to the silicon substrate 32, thereby cutting the silicon substrate 32 along the line 5 together with the glass substrate 31 part and the resin layer 33.

The modified regions $7_3$, which are formed only in the part on the silicon substrate 32 side from the center in the thickness direction of the glass substrate 31 in this embodiment, may be formed on the front face 3 side of the center in the thickness direction thereof or in substantially the whole region of the glass substrate 31. This can reduce the load at the time of breaking (at the time of cutting), for example.

The modified regions $7_1$, which are produced by a plurality of normal modified regions Sy formed in the silicon substrate 32 in this embodiment, may be produced by a plurality of multipoint elongated modified spots Sx formed in the silicon substrate 32. The modified regions $7_2$, which are produced by a plurality of modified regions Sx formed in the resin layer 33 in this embodiment, may be produced by a plurality of normal modified spots Sy formed in the resin layer 33.

Though embodiments in accordance with one aspect of the present invention are explained in the foregoing, the present invention is not limited to the above-mentioned embodiments but may be modified or applied to others within the scope not changing the gist set forth in each claim.

For example, while the above-mentioned second embodiment forms the modified regions $7_1$ to $7_3$ in this order, it is not restrictive; a plurality of rows of modified regions 7 may be formed in any order in the object 1. In the above-mentioned second embodiment, four or more rows of modified regions 7 may be formed within the object 1 at positions different from one another in the thickness direction. For example, any of the modified regions $7_1$, $7_2$, $7_3$ may be formed by a plurality of rows.

Though the above-mentioned embodiments employ the front face 3 and rear face 21 as the "laser light entrance surface" and "the surface opposite to the laser light entrance surface," respectively, the front face 3 becomes the "surface opposite to the laser light entrance surface" when the rear face 21 is the "laser light entrance surface." In the above-mentioned, embodiments, a fracture reaching at least one of the front face 3 and rear face 21 may be generated from the modified region 7. One aspect of the present invention can also be regarded as a chip manufactured by the above-mentioned laser processing device or method.

FIG. 18 is a diagram for explaining aberrations occurring at converging positions of laser light. The laser light L converges geometrically at a single point when it is a plane wave (has a planar wavefront (phase)). On the other hand, while the plane-wave laser light L typically changes its wavefront under various influences, the laser light L converged at the object 1 may fail to converge at the single point, i.e., aberrations may occur naturally. Examples of the aberrations include Seidel aberrations (astigmatism, coma, spherical aberration, curvature of field, and distortion), longitudinal aberration which is an aberration in the longitudinal direction (along the optical axis direction), and lateral aberration which is an aberration in a direction intersecting the longitudinal direction.

When the laser light L is made incident on the object 1 by the converging optical system 204 (see FIG. 11) and the like in the process of being converged at the object 1, a spherical aberration in which light beams having different angles of incidence converge at different positions by refraction (Snell's law) naturally occurs as illustrated in FIG. 18, for example. That is, as depicted, since the laser light L is converged at the object 1, an aberration occurs naturally at the converging position, whereby a range of the aberration along the optical axis direction (a range where the intensity of the laser light L is a processing threshold or greater) exists as a reference aberration range H.

It is found that adding a new aberration to the aberration including a spherical aberration and the like caused by such converging of the laser light L (hereinafter referred to as "converging-induced aberration") can control the processing quality. An example of techniques for adding the new aberration is a phase modulation of the laser light L with the reflective spatial light modulator 203 as an aberration providing part for providing an aberration as in the above-mentioned embodiments. By the phase modulation is meant modulating a wavefront (phase) of the laser light L into a given form.

Examples of the phase modulation include those achieving an action of an axicon lens, attaining an action of a diffraction grating, and generating a predetermined spherical aberration. These examples can be performed by causing the reflective spatial light modulator 203 to display an axicon lens pattern, a diffraction grating pattern, and a predetermined spherical aberration pattern, respectively, for instance. As a technique for adding a new aberration, a lens providing an aberration may be used, or a medium may be inserted in the process of converging, while each of the lens and medium constitutes the aberration providing part in such a case.

Therefore, in the above-mentioned embodiments, the laser light L may include at its converging position not only the aberration provided by the phase modulation with the axicon lens pattern Ax but the converging-induced aberration. When no modulation patterns are displayed in the liquid crystal layer 216 of the reflective spatial light modulator 203 at the time of forming the modified region $7_1$, the laser light L may include the converging-induced aberration at its converging position. Here, other phase modulations may be added to the phase modulation caused by the axicon lens pattern Ax (other patterns may be additionally displayed in the liquid crystal layer 216).

INDUSTRIAL APPLICABILITY

One aspect of the present invention can provide a laser processing device and laser processing method which can improve the processing quality.

REFERENCE SIGNS LIST

1: object to be processed; 5, 5a, 5b: line to cut; 7, $7_1$, $7_2$, $7_3$: modified region; 31: glass substrate (glass part); 32: silicon substrate (silicon part); 33: resin layer (resin part); 100, 300: laser processing device; 101, 202: laser light source; 102: laser light source controller (controller); 115: stage controller (controller); 203: reflective spatial light modulator (spatial light modulator); 204: converging optical system; 216: liquid crystal layer (display part); 250: controller; a1: circular region; a2: circular ring region; Ax: axicon lens pattern; d: modified dot; Sx: modified spot; L: laser light.

The invention claimed is:

1. A laser processing device for converging laser light at an object to be processed having a silicon part containing silicon mounted on a glass part containing glass with a resin part interposed therebetween so as to form a modified region within the object along a line to cut, the laser processing device comprising:
   a laser light source emitting the laser light;
   a spatial light modulator modulating the laser light emitted from the laser light source; and
   a converging optical system converging the laser light modulated by the spatial light modulator at the object;
   wherein, when forming the modified region in the glass part, the spatial light modulator displays an axicon lens pattern as a modulation pattern so as to form converging points at a plurality of positions juxtaposed close to each other along a laser light irradiation direction.

2. A laser processing device according to claim 1, wherein the laser processing device forms a plurality of modified spots within the object along the line and lets a plurality of the modified regions form the modified region;
   wherein, when forming the modified region in the glass part, the spatial light modulator forms modified dots respectively at the plurality of positions juxtaposed close to each other along the laser light irradiation direction; and
   wherein a plurality of the modified dots constitute the modified spot elongated in the laser light irradiation direction.

3. A laser processing device according to claim 1, wherein, in a display part of the spatial light modulator, the axicon lens pattern has a circular region located at a center of the laser light incident thereon and a plurality of circular ring regions demarcated about the center region concentrically with the circular region; and
   wherein each of the circular region and the plurality of circular ring regions is set such as to increase brightness gradually from radially outer side to inner side.

4. A laser processing device according to claim 1, further comprising a controller controlling the laser light;
   wherein the controller controls a position of a converging point of the laser light so as to form the modified region within the glass part, only in a part on the silicon part side from a center of the glass part, in the laser light irradiation direction.

5. A laser processing device according to claim 1, wherein, when forming the modified region in the resin part, the spatial light modulator displays an axicon lens pattern as a modulation pattern, so as to converge the laser light such that converging points are formed respectively at a plurality of positions juxtaposed close to each other along the laser light irradiation direction.

6. A laser processing method for converging laser light at an object to be processed having a silicon part containing silicon mounted on a glass part containing glass with a resin part interposed therebetween so as to form a modified region within the object along a line to cut, the method comprising the step of:
   forming the modified region in the glass part by modulating the laser light emitted from a laser light source with a spatial light modulator and converging the laser light modulated by the spatial light modulator within the glass part;
   wherein the step of forming the modified region in the glass part causes the spatial light modulator to display an axicon lens pattern as a modulation pattern so as to form converging points within the glass part at a plurality of positions juxtaposed close to each other along a laser light irradiation direction.

7. A laser processing device according to claim 2, wherein, in a display part of the spatial light modulator, the axicon lens pattern has a circular region located at a center of the laser light incident thereon and a plurality of circular ring regions demarcated about the center region concentrically with the circular region; and wherein each of the circular region and the plurality of circular ring regions is set such as to increase brightness gradually from radially outer side to inner side.

8. A laser processing device according to claim 2, further comprising a controller controlling the laser light;

wherein the controller controls a position of a converging point of the laser light so as to form the modified region within the glass part, only in a part on the silicon part side from a center of the glass part, in the laser light irradiation direction.

9. A laser processing device according to claim 3, further comprising a controller controlling the laser light;

wherein the controller controls a position of a converging point of the laser light so as to form the modified region within the glass part, only in a part on the silicon part side from a center of the glass part, in the laser light irradiation direction.

10. A laser processing device according to claim 2, wherein, when forming the modified region in the resin part, the spatial light modulator displays an axicon lens pattern as a modulation pattern, so as to converge the laser light such that converging points are formed respectively at a plurality of positions juxtaposed close to each other along the laser light irradiation direction.

11. A laser processing device according to claim 3, wherein, when forming the modified region in the resin part, the spatial light modulator displays an axicon lens pattern as a modulation pattern, so as to converge the laser light such that converging points are formed respectively at a plurality of positions juxtaposed close to each other along the laser light irradiation direction.

12. A laser processing device according to claim 4, wherein, when forming the modified region in the resin part, the spatial light modulator displays an axicon lens pattern as a modulation pattern, so as to converge the laser light such that converging points are formed respectively at a plurality of positions juxtaposed close to each other along the laser light irradiation direction.

* * * * *